(12) United States Patent
Kern et al.

(10) Patent No.: US 6,711,080 B2
(45) Date of Patent: Mar. 23, 2004

(54) EVALUATION CIRCUIT FOR READING OUT AN INFORMATION ITEM STORED IN A MEMORY CELL

(75) Inventors: Thomas Kern, München (DE); Esther Vega Ordonez, München (DE); Matthias von Daak, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/100,583

(22) Filed: Mar. 18, 2002

(65) Prior Publication Data

US 2002/0145910 A1 Oct. 10, 2002

(30) Foreign Application Priority Data

Mar. 19, 2001 (DE) .......................... 101 13 239

(51) Int. Cl.[7] .............................. G11C 7/02; G11C 7/00; G11C 16/06
(52) U.S. Cl. .................... 365/210; 365/203; 365/185.2; 365/185.21
(58) Field of Search ................................ 365/210, 203, 365/185.2, 185.21

(56) References Cited

U.S. PATENT DOCUMENTS

| | | | | | |
|---|---|---|---|---|---|
| 4,648,074 | A | * | 3/1987 | Pollachek ..................... | 365/210 |
| 5,218,570 | A | * | 6/1993 | Pascucci et al. ............. | 365/210 |
| 5,889,702 | A | * | 3/1999 | Gaultier et al. ........... | 365/185.2 |
| 6,400,607 | B1 | * | 6/2002 | Pasotti et al. ............. | 365/185.2 |
| 6,459,620 | B1 | * | 10/2002 | Eshel ........................ | 365/185.2 |
| 6,535,428 | B2 | * | 3/2003 | Pasotti et al. ............. | 365/185.2 |
| 6,542,409 | B2 | * | 4/2003 | Yamada .................... | 365/185.2 |

* cited by examiner

Primary Examiner—Trong Phan
(74) Attorney, Agent, or Firm—Welsh & Katz, LTD.

(57) ABSTRACT

The invention relates to an evaluation circuit for reading out the information stored in a memory cell, the current (read-out current) carried on a bit line (3) being assessed, the evaluation circuit (10) comprising a bit line decoder (2) and a precharge and converter circuit (4). In order to reduce the read-out duration particularly in the case of large scale integrated memory cells (1), a current source (6) is provided, which increases the read-out current ($I_{meas}$) by an offset current ($I_{off}$).

8 Claims, 6 Drawing Sheets

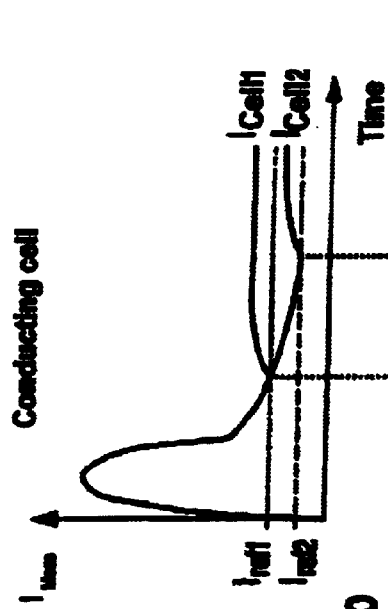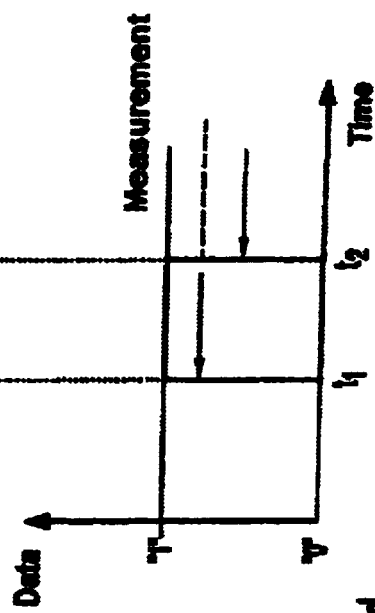
Fig. 2a
Prior Art
Fig. 2b
Prior Art
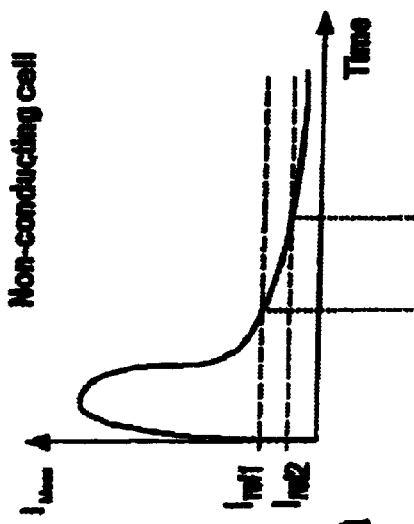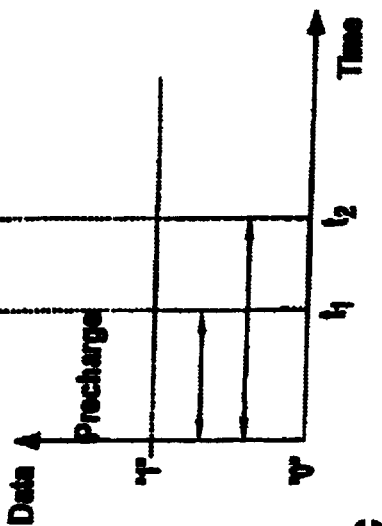
Fig. 2c
Prior Art
Fig. 2d
Prior Art

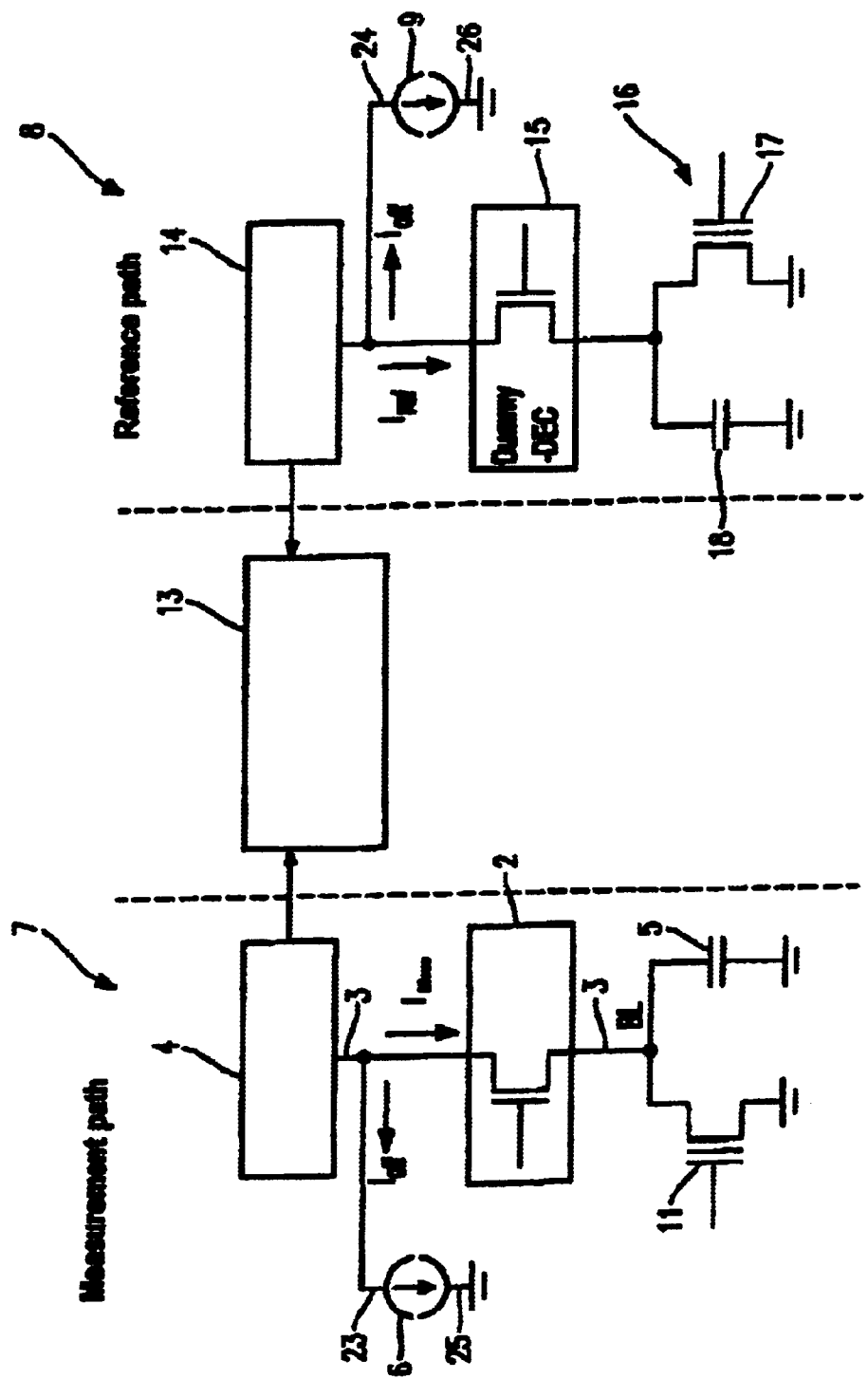

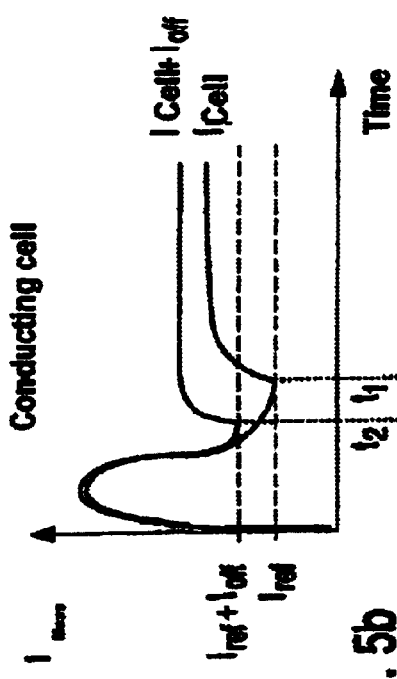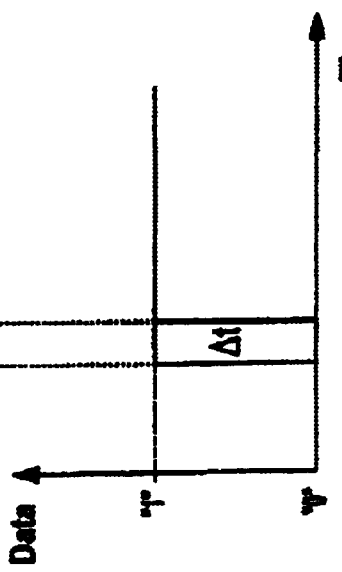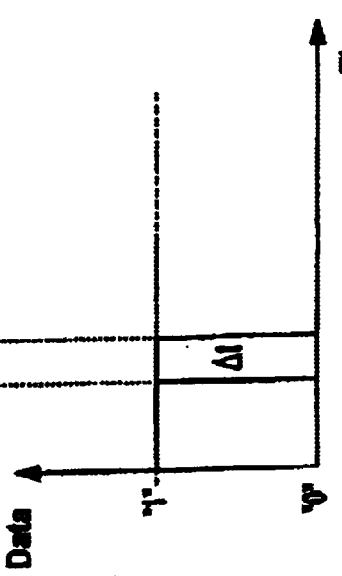
Fig. 5a  Fig. 5b  Fig. 5c  Fig. 5d

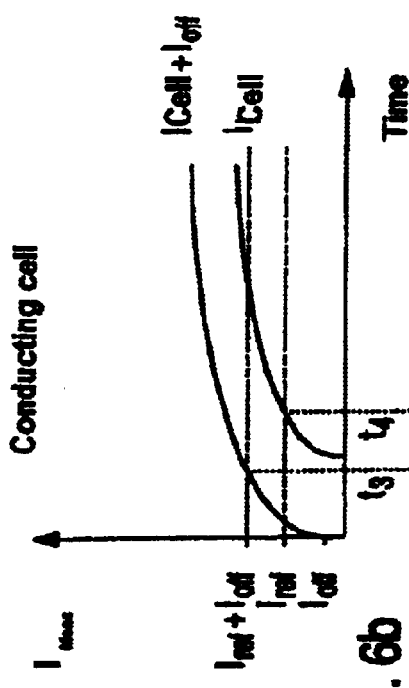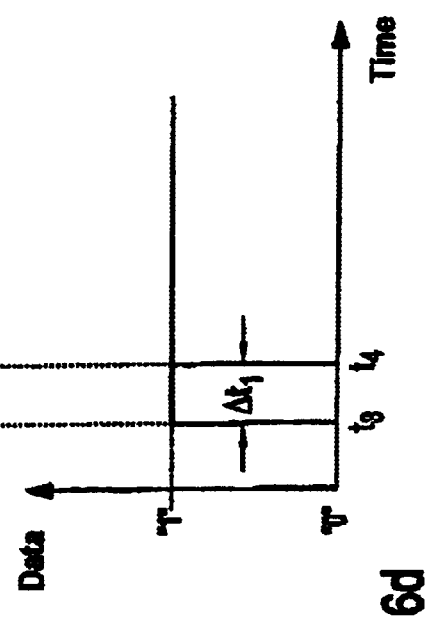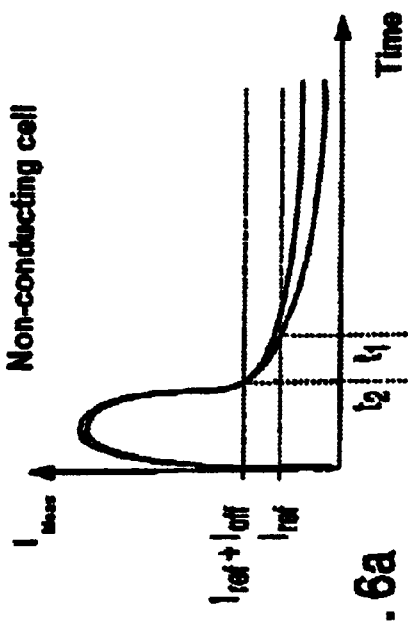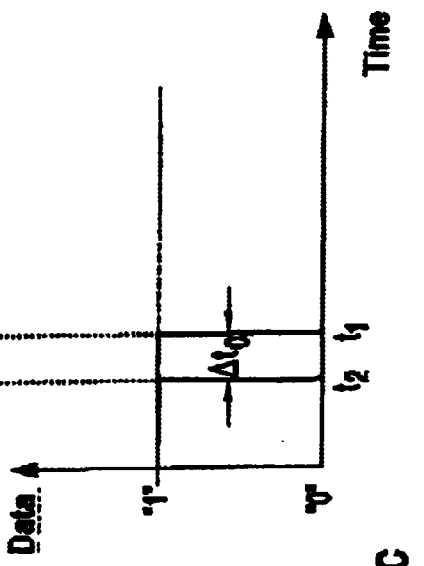
Fig. 6a
Fig. 6b
Fig. 6c
Fig. 6d

EVALUATION CIRCUIT FOR READING OUT AN INFORMATION ITEM STORED IN A MEMORY CELL

The invention relates to an evaluation circuit for reading out the information stored in a memory cell in accordance with the preamble of Patent claim 1.

U.S. Pat. No. 5,889,702 describes an evaluation circuit for an EPROM, in which two auxiliary current sources are respectively connected in parallel with the cell to be measured and with a reference cell. The current sources in this case serve for setting the operating point of a current mirror.

Integrated memory modules having memory cells in which binary information items are stored, such as e.g. EPROMs, DRAMs or SRAMs, are widespread. In order to assess the information stored in the memory cell, the current (read-out current) carried on the bit line is assessed.

With increasing integration of the cell structures far into the sub-micron range—the intention is to achieve structural dimensions down to 0.13 micrometer—the cell current becomes smaller and smaller and, accordingly, the read-out speed of the cells also decreases. On the other hand, the clock frequencies of the memory modules and thus the access speed become higher and higher, with the result that the small cell currents constitute a serious problem.

In the case of very high miniaturization of the cells, it is hardly possible to distinguish the cell current of a conducting cell from the cell current of a non-conducting cell, which makes the assessment particularly difficult. In the case of very high miniaturization, the cell current window, i.e. the difference between conducting cell and non-conducting cell, becomes ever smaller. In order that the read access time, that is to say the time required for determining the stored information, is kept as short as possible, one possibility is to reduce the bit line capacitance. However, this requires larger memory modules.

However, this requires smaller sectors. This means, however, that the number of sectors and the associated area overhead increases for a given storage capacity. The area overhead increases significantly with increasing miniaturization. On the other hand, the required memory demand in the applications increases. The overall result of this is an unacceptable disadvantage in respect of area.

Another possibility for increasing the cell current would be, e.g. to apply higher gate voltages to the transistor of the memory cells. However, on the one hand, this would necessitate additional voltage sources, and charge pumps arranged on the chip would require an excessively large area in order to take account of this alternative. On the other hand, increasing the gate voltage is generally unacceptable for reasons of reduced reliability. The problems which arise with the application of conventional measuring devices are illustrated by way of example in FIGS. 1–3.

FIG. 1 shows a known evaluation circuit for reading out the cell current of a memory cell 1, said cell current being carried on a bit line 3, with an evaluation path 7 and a reference path 8.

The evaluation path 7 comprises the memory cell 1 with a floating gate transistor 11, a bit line decoder 2 with selection transistors 12, and a precharge and converter circuit 4 for precharging the bit line capacitance 5 and for converting the read-out current $I_{Meas}$. The memory cell 1, the bit line decoder 2 and the precharge and converter circuit 4 are connected in series in this case.

The bit line capacitances 5 and 18 are in each case parasitic capacitances.

The evaluation circuit illustrated in FIG. 1 operates according to the differential principle and has a reference path 8 constructed symmetrically with respect to the evaluation path 7. The evaluation circuit furthermore comprises a current or voltage comparator 13, which is in each case connected to the precharge and converter circuit 4 and 14, respectively, and compares the (amplified) read-out current of the evaluation path 7 with the (amplified) reference current of the reference path 8 or corresponding voltages with one another. Common-mode interference, in particular, is suppressed by means of the differential principle.

As already mentioned, the reference path 8 comprises a circuit arrangement constructed symmetrically with respect to the evaluation path 7, with a precharge and converter circuit 14, a dummy decoder 15 and a memory cell 16 with a floating gate transistor 17.

FIG. 2 shows the typical profile of the read-out current $I_{meas}$ for a non-conducting and a conducting cell.

The read-out of the cell current by the evaluation circuit 10 comprises a precharge phase, in which the parasitic bit line capacitance 5 is charged, and an evaluation phase, in which the read-out current $I_{Meas}$ is compared with the reference current $I_{ref}$ and a corresponding output value is output.

The precharge and evaluation phases can be effected either simultaneously or temporally successively. The former method has the advantage of faster assessment, while the latter method has a lower energy consumption.

FIG. 2 shows the profile of the read-out current $I_{Meas}$ in the case of an assessment according to the serial principle for a non-conducting cell (left-hand half of the figure) and a conducting cell (right-hand half of the figure).

The cell transistor 11 is deactivated ($V_G=0$) during the precharge phase, a current flowing ($V_G\neq 0$) through the transistor 11 only during the evaluation phase, i.e. for times t>t1 or t2.

FIG. 2a shows the characteristic current profile for a non-conducting cell. The form of the charging current and thus also the duration of the precharge phase are determined by the parasitic bit line capacitance 5.

The changeover instant between the precharge phase and the evaluation phase is determined by a reference current which is variably adjustable and is usually set approximately in the middle of the maximum current flowing through the memory cell, i.e. from $I_{Cell}1$ to $I_{Cell}2$.

FIG. 2a shows two reference currents $I_{ref1}$ and $I_{ref2}$ for memory cells with a different structural dimension, the index "2" denoting the cell with the higher integration. As can be seen in FIG. 2b, the cell currents $I_{Cell}$ decrease with higher integration.

The read-out current $I_{Meas}$ falls below the respective reference current at the instant t1 and t2 (cf. FIG. 2c); this specifies the duration of the precharge phase and the beginning of the evaluation phase.

In the case of a conducting cell (cf. FIG. 2b), the evaluation operation begins when the charging current reaches the reference current $I_{ref}$. In this case, the assessment yields a logic "1", since the cell current $I_{Cell}$ lies above the reference current.

In the case of the non-conducting cell of FIG. 2a, the read-out current $I_{Meas}$ lies below the respective reference current $I_{ref}$ starting from the instant t1 and t2, so that a logic "0" is output by the evaluation circuit.

FIG. 3 shows an assessment of a memory cell according to the dynamic principle, in the case of which a cell current flows from the beginning of the measurement (the gate voltage of the transistor 11 is $V_G\neq 0$).

In the case of the non-conducting cell, the read-out current $I_{Meas}$ falls below the corresponding reference current $I_{ref}$ after a time t1 and t2. For the smaller cell ($I_{ref2}$), the measurement instant is shifted by $\Delta t_0$ relative to the less highly integrated cell ($I_{ref1}$) (cf. FIG. 3c).

Proceeding from the worst case, in which the bit line capacitance is completely charged, in the case of a conducting cell the read-out current $I_{Meas}$ exceeds the corresponding reference current $I_{ref1}$ and $I_{ref2}$ at the instant t3 and t4, respectively, as is shown in FIGS. 3b and 3d. Relative to the less highly integrated cell, the measurement instant is shifted by $\Delta t_1$, relative to the less highly integrated cell ($I_{ref1}$) (cf. FIG. 3d).

The object of the present invention, therefore, is to provide an evaluation circuit with which significantly faster read-out times are achieved.

This object is achieved according to the invention by means of the features specified in Patent claim 1. Subclaims relate to further embodiments of the invention.

An evaluation circuit or measuring circuit according to the invention for reading out the information stored in a memory cell, the current (read-out current) carried on a bit line being assessed, comprises a bit line decoder for selecting a specific memory cell and a precharge and converter circuit for precharging the parasitic bit line capacitance and for converting the read-out current. The essential inventive concept consists in increasing the read-out current by an additional current source (offset current) and thereby reducing the read-out duration.

In accordance with a preferred embodiment of the invention, the additional current source is arranged in parallel with the transistor of the memory cell.

In this case, the current source is preferably connected to the bit line between the precharge and converter circuit and the bit line decoder.

The current intensity of the additional current source preferably amounts to between 20 and 80% and in particular between 40 and 60% of the cell current without a current source. Cell current in this case denotes the current flowing through the transistor of the memory cell.

In accordance with a preferred development of the invention, the evaluation circuit comprises a reference path which is symmetrical with reference to the evaluation path, the output quantities of the evaluation path and also of the reference path being fed to a current or voltage comparator, which outputs a resultant value at its output.

The reference path, just like the evaluation path, preferably comprises an additional current source, which is preferably arranged at the same location as in the evaluation path.

The invention is explained in more detail below by way of example with reference to the accompanying drawings, in which:

FIG. 2 shows the profile of the read-out current in the case of a non-conducting cell and of a conducting cell when using a known evaluation circuit in serial measurement operation;

FIGS. 2a, 2b, 2c and 2d show the profile of the read-out current in the case of a non-conducting cell and of a conducting cell when using a known evaluation circuit in serial measurement operation;

FIG. 4 shows a schematic construction of an evaluation circuit with additional current sources in accordance with an exemplary embodiment of the invention;

FIGS. 5a, 5b, 5c and 5d show the profile of the read-out current for a non-conducting and a conducting cell in the case of serial operation of the measuring device; and FIGS. 6a, 6b, 6c and 6d show the profile of the read-out current for a non-conducting cell and a conducting cell in the case of dynamic operation of the evaluation circuit of FIG. 3.

Figure 1:
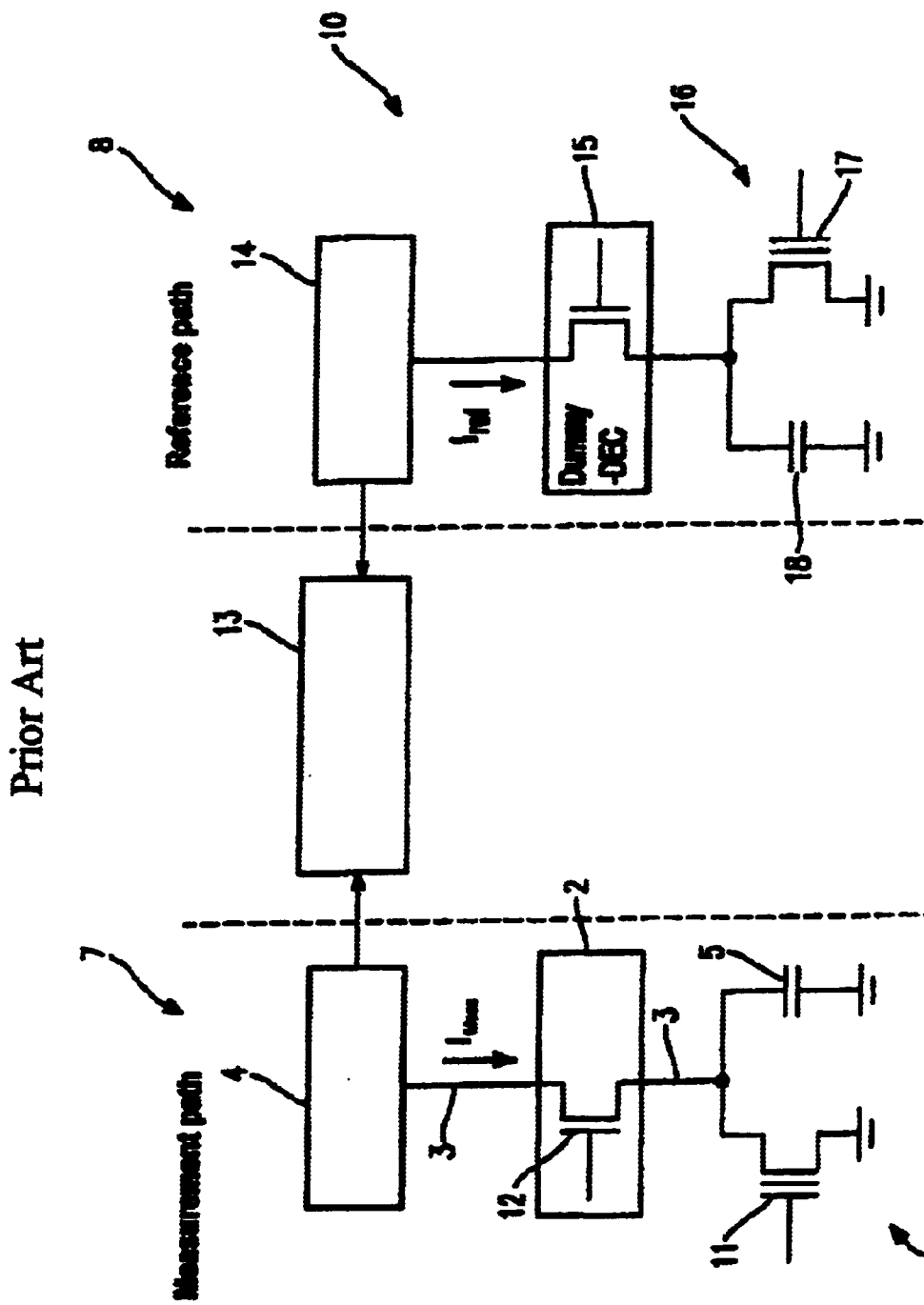
FIG. 1 shows the typical construction of a known measuring device which operates according to the differential principle.
Figure 3A:
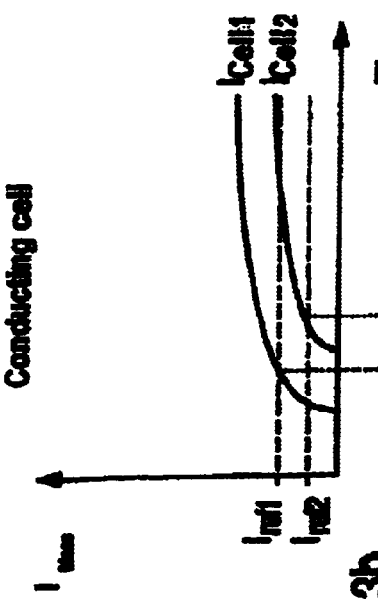
FIGS. 3a, 3b, 3c and 3d show the profile of the read-out current in the case of a non-conducting cell and of a conducting cell when using a known evaluation circuit in dynamic measurement operation.
Figure 3B:
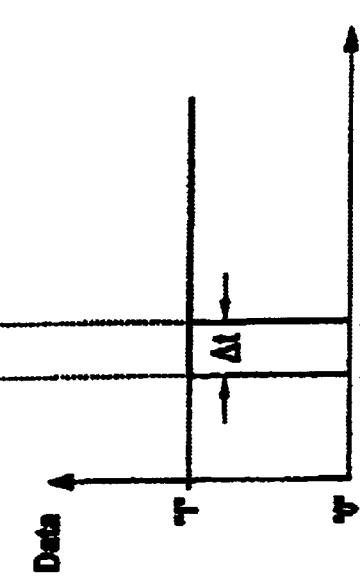
Figure 3C:
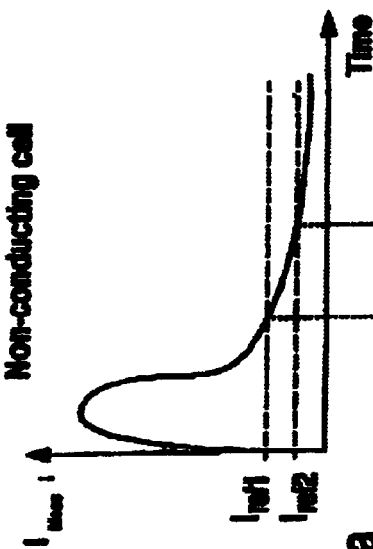
Figure 3D:
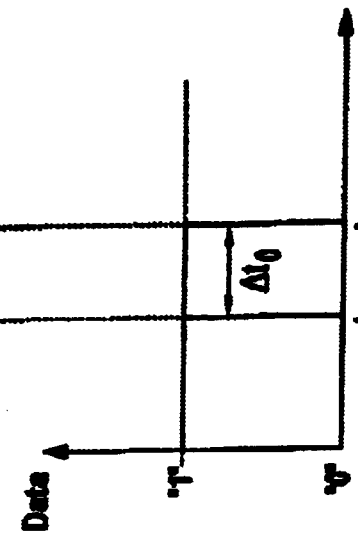

With regard to the description of FIGS. 1–3, reference is made to the introduction to the description.

FIG. 4 shows the schematic construction of a measuring device which operates according to the differential method and is constructed essentially identically to the evaluation circuit shown in FIG. 1, reference being made here, too, to the description in this respect.

The essential point of the novel evaluation circuit is an additional DC source 6 and 9 inserted both into the evaluation path 7 and into the evaluation path 8, respectively. The current source 6, 9 is essentially arranged in parallel with the respective memory cell 1 and 17 and is connected to the bit line 3 by one terminal.

This current source 6, 9 increases the read-out current $I_{Meas}$ by an offset current $I_{off}$, as a result of which charging and discharging operations can be effected significantly faster and, consequently, the read-out time is reduced.

The offset current preferably has the same magnitude in both paths 7, 8.

A first terminal 23, 24 of the additional current source 6, 9 is connected to the bit line between the precharge and converter circuit 4, 14 and the bit line decoder 2, 15. A second terminal 25, 26 of the additional current source 6, 9 is connected to ground.

As is shown in FIG. 5a, the read-out current $I_{Meas}$ converges to the offset current $I_{off}$ for longer times in the case of a non-conducting cell.

In the worst case, namely with an uncharged bit line, the additional current reduces the voltage of the bit line by $\Delta V_{DL}$ (proportional to $I_{off}^{1/2}$), as a result of which the read-out current reaches the reference value significantly faster (cf. FIG. 5b). This results in a reduction of the precharge phase by $\Delta t = (t2-t1)$, as is illustrated in FIGS. 5c and 5d.

In dynamic operation of the measuring device, as is illustrated in FIG. 6, the read-out current $I_{Meas}$ likewise reaches its reference value ($I_{Cell}+I_{off}$) significantly faster than without an additional current source, (cf. FIG. 6b). In the case of a conducting cell, the read-out current $I_{Meas}$ obtained with an additional current source also reaches the reference value ($I_{ref}+I_{off}$) significantly earlier than without an additional current source. The memory cell can therefore be read faster by a time difference $\Delta t1$.

In the case of a non-conducting cell (FIG. 6a), the precharge current which flows in the case of an uncharged bit line limits the read-out speed. In a similar manner to that in the case of the serial operation explained above with respect to FIG. 5a, an additional current source has the effect here, too, that the cell can be read significantly faster. As is illustrated in FIG. 6, the instant at which the evaluation phase commences is shifted by a time period $\Delta t_0$.

What is claimed is:

1. Evaluation circuit for reading out an information item stored in a memory cell, a read-out current $I_{meas}$ carried on a bit line being assessed, having a bit line decoder for selecting a specific memory cell, and a precharge and converter circuit for precharging a parasitic bit line capacitance and for converting the read-out current ($I_{meas}$) taken up, wherein an additional current source is provided, which increases the read-out current ($I_{meas}$).

2. Evaluation circuit according to claim 1, wherein the current source is connected into the evaluation path in parallel with the memory cell.

3. Evaluation circuit according to claim 1, wherein the current source is connected to the bit line between the precharge and converter circuit and the hit line decoder.

4. Evaluation circuit according to claim 1, wherein the current of the current source amounts to approximately 20–80% and in particular 40–60% of the cell current without an additional current source.

5. Evaluation circuit according to claim 1, wherein the evaluation circuit has a reference path constructed symmetrically with the respect the evaluation path.

6. Evaluation circuit according to claim 5, wherein, the reference path likewise has an additional current source.

7. Evaluation circuit according to claim 5, wherein the current source in the reference path is arranged at the same location as the current source in the evaluation path.

8. Evaluation circuit according to claim 5, wherein the evaluation circuit futhermore has a current or voltage comparator.

\* \* \* \* \*